United States Patent
Tsuchiaki

Patent Number: 6,127,237
Date of Patent: Oct. 3, 2000

[54] ETCHING END POINT DETECTING METHOD BASED ON JUNCTION CURRENT MEASUREMENT AND ETCHING APPARATUS

[75] Inventor: Masakatsu Tsuchiaki, Tokyo, Japan

[73] Assignee: Kabushiki Kaisha Toshiba, Kawasaki, Japan

[21] Appl. No.: 09/034,220

[22] Filed: Mar. 4, 1998

[51] Int. Cl.[7] .................................................. H01L 21/20
[52] U.S. Cl. .............................. 438/381; 438/13; 438/17; 438/741
[58] Field of Search ............................ 438/13, 17, 381, 438/514, 741, 705

[56] References Cited

U.S. PATENT DOCUMENTS

| | | | |
|---|---|---|---|
| 3,890,215 | 6/1975 | DiLorenzo et al. | 205/656 |
| 4,358,338 | 11/1982 | Downey et al. | 204/192.33 |
| 4,793,895 | 12/1988 | Kaanta et al. | 438/17 |
| 5,071,510 | 12/1991 | Findler et al. | 438/17 |
| 5,173,149 | 12/1992 | Nojiri et al. | 205/644 |
| 5,456,788 | 10/1995 | Barbee et al. | 156/345 |
| 5,643,803 | 7/1997 | Fukada et al. | 438/50 |
| 5,702,956 | 12/1997 | Ying et al. | 438/17 |
| 5,869,876 | 2/1999 | Ishio et al. | 257/419 |

FOREIGN PATENT DOCUMENTS

| | | |
|---|---|---|
| 53-87667 | 8/1978 | Japan . |
| 53-135842 | 11/1978 | Japan . |
| 54-8465 | 1/1979 | Japan . |
| 54-55377 | 5/1979 | Japan . |
| 55-87437 | 7/1980 | Japan . |
| 57-13745 | 1/1982 | Japan . |
| 60-167332 | 8/1985 | Japan . |
| 4-107928 | 4/1992 | Japan . |

*Primary Examiner*—Carl Whitehead, Jr.
*Assistant Examiner*—Jamie L. Davis
*Attorney, Agent, or Firm*—Banner & Witcoff, Ltd.

[57] ABSTRACT

A pn junction is formed at a to-be-etched depth in an etching region of a semiconductor body and a reverse bias voltage is applied to the pn junction to form a depletion layer. Then, the semiconductor body is etched while monitoring the reverse bias current flowing via the pn junction and a point at which the bias current has abruptly increased is determined as the etching end point.

34 Claims, 10 Drawing Sheets

ETCHING END POINT DETECTING METHOD BASED ON JUNCTION CURRENT MEASUREMENT AND ETCHING APPARATUS

BACKGROUND OF THE INVENTION

This invention relates to an etching process for manufacturing a semiconductor device, and more particularly to a method for accurately detecting the etching end point or monitoring the etching depth with high precision and an etching apparatus using the above method.

When a semiconductor device is manufactured, the etching process is effected in various steps such as patterning a conductive layer used as wirings and electrodes, forming contact holes and through holes, and forming shallow trenches for device isolation. In the above various etching steps, conventionally, the etching end point is detected by a measuring or predicting method using, for example, (a) visual observation by the operator, (b) interrupting the progress of the etching process by using a stopper layer formed of a material having a high selective etching ratio with respect to a material to be etched, (c) predicting the etching depth based on the etching rate of a sample previously processed and controlling the etching depth according to the etching time, (d) predicting the etching depth by measuring the amount of a gas emitted at the time of etching, and (e) measuring the etching depth by use of the interference of the laser beam due to the optical path difference between the incident light and the reflected light.

In recent years, for highly integrated electric circuits, for example, DRAMs, STI (shallow trench isolation) structures and DT (deep trench) structures are employed widely. In a DRAM with STI structure, a shallow trench is formed on the semiconductor surface and an insulating material fills up the trench to attain electrical isolation between devices. In a DRAM with DT structure, a deep trench is formed on the main surface of the semiconductor substrate and capacitor electrodes are embedded in the trench to attain a large capacitance without increasing the chip occupancy area. In order to form the STI structure or DT structure, it is required to use a technique for forming a fine trench with high precision by the etching process.

However, if any one of the above etching end point detecting methods (a) to (e) is used, it is difficult to detect an etching end point with such sufficiently high precision that is required for fabrication of a 256 Mb DRAM and for an electrical circuit of even larger integration, a large-scale measuring equipment is required and the cost of the etching apparatus is raised. For example, with the method (a), it is difficult to accurately determine the etching depth and it is almost impossible to determine the etching end point, particularly, when the etching process with a high aspect ratio is required as in the DT structure. For trench formation in a semiconductor substrate made of a single material, the method (b) cannot be used. Further, since the methods (c) and (d) are based on prediction or indirect measurement, they tend to be influenced by a fluctuation in the manufacturing process and a required high precision cannot be attained. Further, with the method (e), since the depth is directly measured, the precision is high but it is necessary to mount a measuring device using a laser beam on the etching apparatus, thereby making the apparatus expensive.

In order to solve the above problems, an electrolytic etching techniques utilizing selective formation of an anode oxide film on an n-type impurity layer and resultant sharp drop of etching current to detect completion of etching of p-type layer is disclosed in U.S. Pat. No. 5,173,149. Further, in U.S. Pat. No. 4,358,338, a physical etching technique for detecting the etching end-point by monitoring the etching current from plasma through a target being etched is disclosed. Further, in Jpn. Pat. Appln. KOKAI Publication No. 60-167332, a RIE etching technique is disclosed in which, after forming an impurity layer extending to the same depth as a groove to be etched and, attaching a pair of measuring probes to opposite sides of the groove, the etching process is stopped when the electrical resistance between them abruptly increases.

However, the technique disclosed in U.S. Pat. No. 5,173,149 is applied to the wet etching process and cannot be applied to the anisotropic etching process such as an RIE (Reactive Ion Etching) process required for forming the STI structure or DT structure. Further, in the technique disclosed in U.S. Pat. No. 4,358,338, the etching end-point is detected by measuring a current flowing from etching plasma through the object being etched. In order to apply the method for an etching process of small and deep trenches, in which total etching area amounts to only a small fraction of total surface area of the object, the current level becomes low, thereby making it difficult to detect the etching end point. Further, in the technique disclosed in Jpn. Pat. Appln. KOKAI Publication No. 60-167332, it is necessary to apply a pair of measuring probes to opposite sides of the groove and the technique cannot be applied to the STI structure and DT structure having hole-like trenches, because a large number of current paths remains even after completion of the etching.

BRIEF SUMMARY OF THE INVENTION

Accordingly, a first object of this invention is to provide a method for manufacturing a semiconductor device capable of precisely detecting the etching end point or precisely monitoring the progress of etching.

A second object of this invention is to provide a method for manufacturing a semiconductor device suitable for detecting the etching end point during formation of the STI structure or DT structure in which fine trenches are required to be formed with high precision or the progress of the etching must be precisely monitored.

A third object of this invention is to provide an etching apparatus capable of precisely detecting the etching end point and monitoring the etching depth without unnecessarily raising the cost of the apparatus.

The first object of this invention can be attained by forming a pn junction at a predetermined depth in a region of a semiconductor body, where an etching process includes applying a reverse bias voltage to the pn junction to form a depletion layer, etching the semiconductor body while monitoring a reverse bias current flowing via the pn junction, and determining a time point at which the reverse bias current has abruptly increased as the etching end point.

According to the above manufacturing method, since the depletion layer at the pn junction previously formed in the to-be-etched region of the semiconductor body is used as a sensor for detecting the etching end point, this method can be applied to the etching process for any type of semiconductor structure including the STI structure and DT structure unlike any type of conventional optical measuring method. Further, since the depth of the pn junction (depletion layer) can be precisely controlled by adequately setting the acceleration energy in the ion-implantation process and effecting the annealing process, the etching end point can be detected with high precision. Further, since it is not necessary to additionally form any elements other than the electrodes for applying a voltage on the wafer (semiconductor body) and it is not necessary to provide a large-scale measuring equipment in the reaction chamber of the etching apparatus, the cost of the etching apparatus will not be unnecessarily raised.

Further, the first object of this invention can be attained by forming a plurality of pn junctions at different depths in a to-be-etched region in a semiconductor body, applying a reverse bias voltage to the pn junctions to form depletion layers, etching the semiconductor body while measuring reverse bias currents flowing via the plurality of pn junctions, and detecting time points at which the reverse bias currents flowing via the respective pn junctions have abruptly increased so as to monitor the etching depths in the regions.

According to the above manufacturing method, since the depletion layers of the plurality of pn junctions with different depths previously formed in the to-be-etched region of the semiconductor body are used as sensors for detecting the etching depths, the progress of etching can be precisely monitored. Further, unlike any type of conventional optical measuring method, this method can be applied to the etching process for any type of semiconductor structure including the STI structure and DT structure. Further, since the depths of the plurality of pn junctions can be precisely controlled by adequately setting the acceleration energy in the ion-implantation process and effecting the annealing process, the progress of etching can be monitored with high precision. Further, since it is not necessary to additionally form any elements other than the electrodes for applying a voltage on the wafer (semiconductor body) and it is not necessary to provide large-scale measuring equipment in the reaction chamber of the etching apparatus, the cost of the etching apparatus will not be unnecessarily raised.

The first object of this invention can be attained by forming a pn junction at a preset depth in a monitoring region of a semiconductor body, applying a reverse bias voltage to the pn junction to form a depletion layer, etching the monitoring region and a to-be-etched region of the semiconductor body while measuring a reverse bias current flowing via the pn junction, determining a time point at which the reverse bias current has abruptly increased as the etching end point.

According to the above manufacturing method, since the depletion layer of the pn junction formed in the monitoring region of the semiconductor body is used as a sensor, this method can be applied, to the etching process for any type of semiconductor structure including the STI structure and DT structure without forming any pn junction in regions of the actual device. Further, since the depth of the pn junction can be precisely controlled by adequately setting the acceleration energy in the ion-implantation process and effecting the annealing process, the etching depth can be set with high precision. Further, since it is not necessary to additionally form any elements other than the monitoring region and the electrodes for applying a voltage on the wafer (semiconductor body) and it is not necessary to provide large-scale measuring equipment in the reaction chamber of the etching apparatus, the cost of the etching apparatus will not be unnecessarily raised.

Further, the first object of this invention can be attained by forming a pn junction at a preset depth in a monitoring region of a semiconductor body, applying a reverse bias voltage to the pn junction to form a depletion layer, etching the monitoring region and a to-be-etched region of the semiconductor body while measuring a reverse bias current flowing via the pn junction, detecting a time point at which the reverse bias current has abruptly increased, further effecting the etching process and controlling the etching depth based on the time of sharp rise in the reverse bias current.

This method can be applied to the etching process for any type of semiconductor structure including the STI structure and DT structure unlike any type of conventional optical measuring method. The depth of the pn junction can be precisely controlled by adequately setting the acceleration energy in the ion-implantation process and effecting the annealing process. Further, since it is not necessary to additionally form any elements other than the monitoring region and the electrodes for applying a voltage on the wafer (semiconductor body) and it is not necessary to provide large-scale measuring equipment in the reaction chamber of the etching apparatus, the cost of the etching apparatus will not be unnecessarily raised.

Further, the first object of this invention can be attained by forming a plurality of pn junctions at different depths in a monitoring region of a semiconductor body, applying a reverse bias voltage to the pn junctions to form depletion layers, etching the semiconductor body while monitoring reverse bias currents flowing via the plurality of pn junctions, and detecting time points at which the reverse bias currents flowing via the respective pn junctions have abruptly increased.

According to the above manufacturing method, since the depletion layers of the plurality of pn junctions with different depths formed in the monitoring region of the semiconductor body are used as sensors to monitor the etching depths, the progress of etching can be monitored with high precision. Further, unlike any type of conventional optical measuring method, this method can be applied to the etching process for any type of semiconductor structure including the STI structure and DT structure. The depths of the plurality of pn junctions can be precisely controlled by adequately setting the acceleration energy in the ion-implantation process and effecting the annealing process. Further, since it is not necessary to additionally form any elements other than the monitoring region and the electrodes for applying a voltage on the wafer (semiconductor body) and it is not necessary to provide large-scale measuring equipment in the reaction chamber of the etching apparatus, the cost of the etching apparatus will not be unnecessarily raised.

The second object of this invention can be attained by steps of forming a pn junction in a region where deep trenches for DRAM are made; forming an etching mask for the deep trenches on the semiconductor surface; applying a reverse bias voltage to the pn junction to develop a depletion layer; subjecting the semiconductor substrate to the anisotropic etching process by use of the mask to form deep trenches while measuring a reverse bias current flowing via the pn junction; and detecting a time point at which the reverse bias current has abruptly increased and terminating the anisotropic etching process.

According to the above manufacturing method, since the depletion layer of the pn junction formed in the deep trench forming region of the semiconductor body is used as a sensor for detecting the etching end point, the etching end point can be easily detected even in a case of deep trench formation unlike any type of conventional optical measuring method. Further, since the depth of the pn junction can be precisely controlled by adequately setting the acceleration energy of the ion-implantation process and effecting the annealing process, the etching end point can be detected with high precision. Further, since it is not necessary to additionally form any elements other than the electrodes for applying a voltage on the wafer and it is not necessary to provide large-scale measuring equipment in the reaction chamber of the etching apparatus, the cost of the etching apparatus will not be unnecessarily raised.

Further, the second object of this invention can be attained by steps of forming a pn junction in a monitoring region in a semiconductor substrate; forming a mask used for etching the monitoring region and deep trenches on the semiconductor substrate; applying a reverse bias voltage to the pn junction to form a depletion layer; subjecting the monitoring region to the anisotropic etching process by use of the mask while measuring a reverse bias current flowing via the pn junction; and detecting a time point at which the reverse bias current has abruptly increased and predicting the end point of the anisotropic etching process for deep trenches based on the etching rate of the monitoring region.

According to the above manufacturing method, since the depletion layer of the pn junction formed in the monitoring region of the semiconductor body is used as a sensor and the etching process for the deep trenches is terminated, the etching end point can be easily detected even in a case of deep trenches unlike any type of conventional optical measuring method. It is not necessary to form a pn junction at the actual device region. Further, the depth of the pn junction can be precisely controlled by adequately setting the acceleration energy in the ion-implantation process and effecting the annealing process. Even though the etching end point is not detected by directly measuring the depth of the deep trench, the etching conditions in the monitoring region and in the deep trench forming region are substantially the same, therefore the etching end point can be detected with sufficiently high precision. Further, since it is not necessary to additionally form any elements other than the monitoring region and the electrodes for applying a voltage on the wafer and it is not necessary to provide large-scale measuring equipment in the reaction chamber of the etching apparatus, the cost of the etching apparatus will not be unnecessarily raised.

Further, the second object of this invention can be attained by steps of forming a pn junction in a region in a semiconductor substrate where shallow trenches of device isolation are to be formed; forming a mask for shallow trenches in the semiconductor substrate; applying a reverse bias voltage to the pn junction to form a depletion layer; subjecting the semiconductor substrate to the anisotropic etching process by use of the mask while monitoring a reverse bias current flowing via the pn junction; and detecting a time point at which the reverse bias current has abruptly increased and then terminating the anisotropic etching process.

According to the above manufacturing method, since the depletion layer is formed at the pn junction in the shallow trench forming region in the semiconductor body and used as a sensor for detecting the etching end point, the etching end point can be easily detected unlike any type of conventional optical measuring method. Further, since the depth of the pn junction can be precisely controlled by adequately setting the acceleration energy in the ion-implantation process and effecting the annealing process, the etching end point can be detected with high precision. Further, since it is not necessary to additionally form any elements other than the electrodes for applying a voltage on the wafer and it is not necessary to provide a large-scale measuring equipment in the reaction chamber of the etching apparatus, the cost of the etching apparatus will not be unnecessarily raised.

The second object of this invention can be attained by steps of forming a pn junction in a monitoring region in a semiconductor substrate; forming a mask on the semiconductor substrate; applying a reverse bias voltage to the pn junction to form a depletion layer; subjecting the semiconductor substrate to the anisotropic etching process by use of the mask while measuring a reverse bias current flowing via the pn junction; and detecting a time point at which the reverse bias current has abruptly increased and predicting the end point of the anisotropic etching end point for shallow trenches based on the etching rate of the monitoring region.

According to the above manufacturing method, since the depletion layer of the pn junction formed in the monitoring region of the semiconductor body is used as a sensor and the etching process for the shallow trenches is terminated according to the etching in the monitoring region, the etching end point can be easily detected even in a case of shallow trenches unlike any type of conventional optical measuring method. Further, the depth of the pn junction can be precisely controlled by adequately setting the acceleration energy in the ion-implantation process and effecting the annealing process. The etching end point is not detected by directly measuring the depth of the shallow trench, but since the etching conditions in the monitoring region and in the shallow trench forming region are substantially the same, the etching end point can be detected with sufficiently high precision. Further, since it is not necessary to additionally form any elements other than the monitoring region and the electrodes for applying a voltage on the wafer and it is not necessary to provide large-scale measuring equipment in the reaction chamber of the etching apparatus, the cost of the etching apparatus will not be unnecessarily raised.

The second object of this invention can be attained by steps of forming a pn junction in a monitoring region in a semiconductor substrate; forming a mask used for etching the monitoring region and deep trenches on the semiconductor substrate; applying a reverse bias voltage to the pn junction to form a depletion layer; subjecting the monitoring region and deep trench forming region to the anisotropic etching process by use of the mask while measuring a reverse bias current flowing via the pn junction; detecting a time point at which the reverse bias current has abruptly increased and predicting the end point of the anisotropic etching process for deep trenches based on the etching rate of the monitoring region; further effecting the etching process to the predicted depth to form the deep trenches.

According to the above manufacturing method, since the depletion layer at the pn junction in the monitoring region of the semiconductor body is used as a sensor and the etching depth of the deep trench can be determined based on the result of the monitoring region, the etching end point can be easily predicted unlike any type of conventional optical measuring method. Further, since the depth of the pn junction can be precisely controlled by adequately setting the acceleration energy in the ion-implantation process and effecting the annealing process, the etching end point can be detected with high precision. The etching end point is not detected by directly measuring the depth of the deep trench, but since the etching conditions in the monitoring region and in the deep trench forming region are substantially the same, the etching end point can be detected with sufficiently high precision. Further, since it is not necessary to additionally form any elements other than the monitoring region and the electrodes for applying a voltage on the wafer and it is not necessary to provide a large-scale measuring equipment in the reaction chamber of the etching apparatus, the cost of the etching apparatus will not be unnecessarily raised.

The third object of this invention can be attained by an etching apparatus comprising a reaction chamber into which a semiconductor body is received; gas supplying means for supplying a gas for etching into the reaction chamber; plasma creating means for converting the gas supplied into the reaction chamber into plasma; voltage applying means for applying a reverse bias voltage to a pn junction formed in a to-be-etched region of the semiconductor body to form a depletion layer; current measuring means for measuring a reverse bias current flowing via the pn junction; and control means for detecting an abrupt increase in the reverse bias current by use of the current measuring means and interrupting at least one of the reactive gas supplying operation and the plasma creating operation.

According to the above construction, since it is only required to additionally attach the voltage applying means, current measuring means and control means to a conventional etching apparatus, it is not necessary to additionally provide a large-scale measuring equipment and the etching end point can be detected without unnecessarily raising the cost of the apparatus. Further, since the control means detects an abrupt increase in the reverse bias current and terminates the etching process, the etching end point can be precisely detected.

Further, the third object of this invention can be attained by an etching apparatus comprising a reaction chamber into which a semiconductor body is received; gas supplying means for supplying a gas for etching into the reaction chamber; plasma creating means for converting the gas supplied into the reaction chamber into plasma; voltage applying means for applying a reverse bias voltage to a pn junction formed in a monitoring region of the semiconductor body to form a depletion layer; current measuring means for measuring a reverse bias current flowing via the pn junction; and control means for interrupting at least one of the reactive gas supplying operation and the plasma creating operation when the current measuring means has detected an abrupt increase in the reverse bias current.

According to the above construction, since it is only required to additionally attach the voltage applying means, current measuring means and control means to a conventional etching apparatus and form the monitoring region in the semiconductor body, the etching end point can be detected without unnecessarily raising the cost of the apparatus. Further, since the control means detects an abrupt increase in the reverse bias current and terminates the etching process, the etching end point can be precisely detected.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
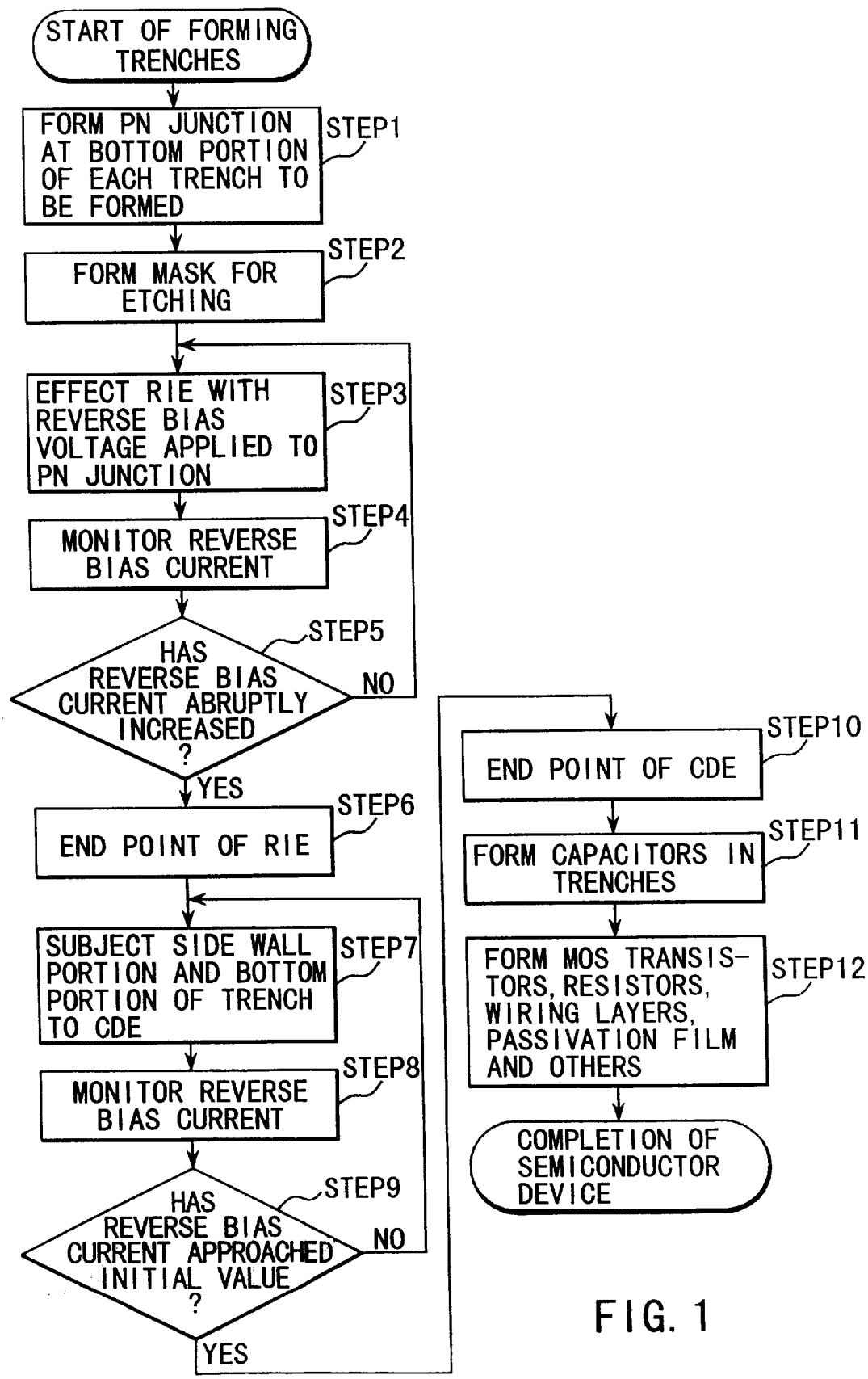
FIG. 1 is a flowchart for illustrating a method for manufacturing a semiconductor device according to a first embodiment of this invention with much attention given to the etching process effected when forming the semiconductor device of DT structure.

FIG. 1 is a flowchart for illustrating a method for manufacturing a semiconductor device according to a first embodiment of this invention with much attention given to the etching process effected when forming the semiconductor device of DT structure, and FIGS. 2A to 2D are cross sectional views showing the states of the semiconductor substrate in the RIE step effected when forming the semiconductor device of DT structure in the order of the manufacturing steps.

Figure 2A:
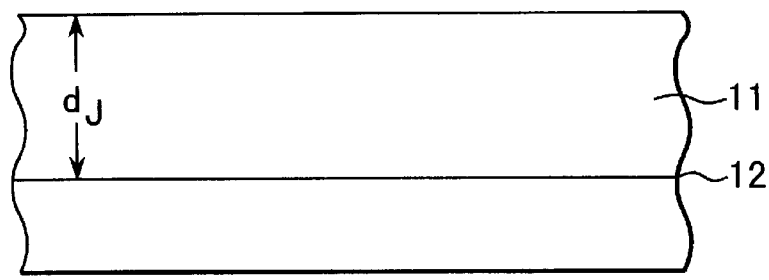
FIGS. 2A to 2D are cross sectional views showing the states of the semiconductor substrate (wafer) in the RIE process effected when forming the semiconductor device of DT structure in the order of the manufacturing steps.

First, as shown in FIG. 2A, an impurity is ion-implanted into a portion of a semiconductor substrate (wafer) 11 below a trench forming region to have a pn junction 12 at a depth corresponding to the bottom portion of each trench to be formed (STEP 1). At this time, the depth $d_J$ of the pn junction 12 is controlled to correspond to the bottom portion of the trench to be formed by adequately setting the acceleration energy in the ion-implantation process and effecting the annealing process.

Figure 2B:
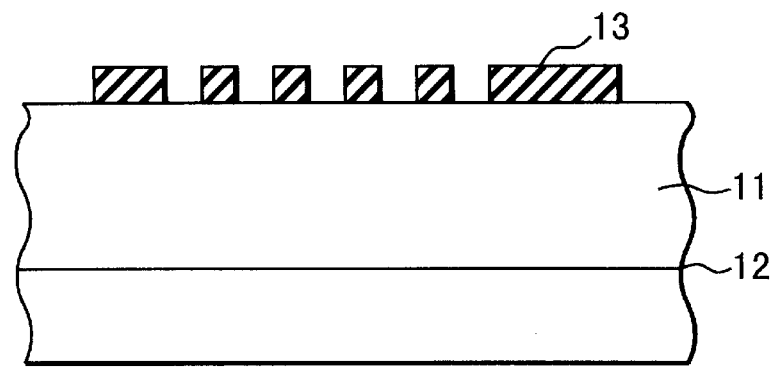

Next, as shown in FIG. 2B, an etching mask 13 used for forming trenches is formed on the main surface of the semiconductor substrate 11 (STEP 2). As the mask 13, for example, a film obtained by forming a TEOS ($SiO_2$) film on the semiconductor substrate 11 and patterning the TEOS film by photolithography is used. In the mask 13, a window for applying a voltage to the main surface of the semiconductor substrate 11 is formed.

Figure 2C:
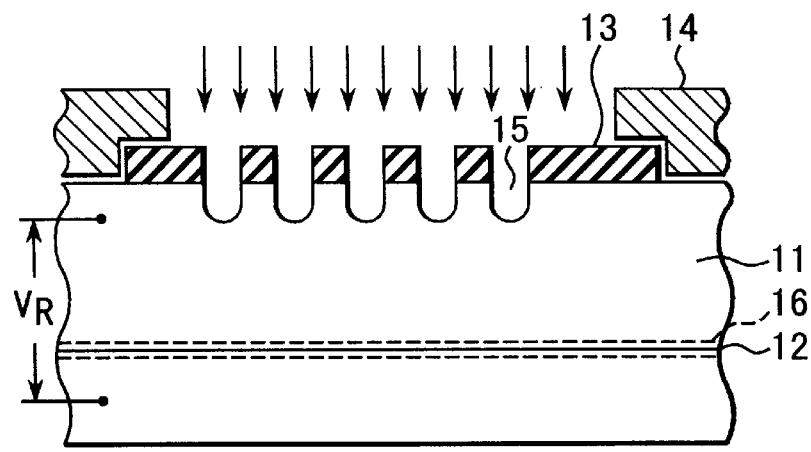

After this, as shown in FIG. 2C, the semiconductor substrate 11 is fixed on a clamp 14, a reverse bias voltage $V_R$ is applied to the pn junction 12 to form a depletion layer 16, and in this state, the RIE (Reactive Ion Etching) process is effected for the semiconductor substrate 11 to form trenches 15 (STEP 3). The RIE process is effected while a reverse bias current flowing in the pn junction 12 is being monitored (STEP 4). Then, whether the reverse bias current has abruptly risen is determined (STEP 5) and the etching process is continued if no abrupt change is detected.

Figure 2D:
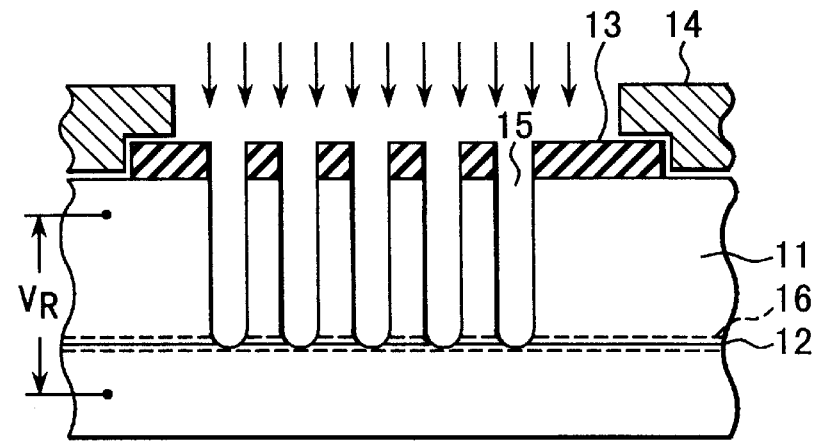
Figure 3A:
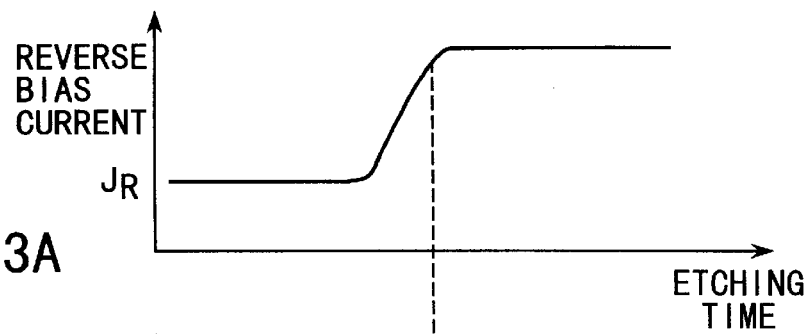
FIG. 3A is a diagram showing the relation between the etching time and the reverse bias current, for illustrating the operation of detecting the etching end point.
Figure 3B:
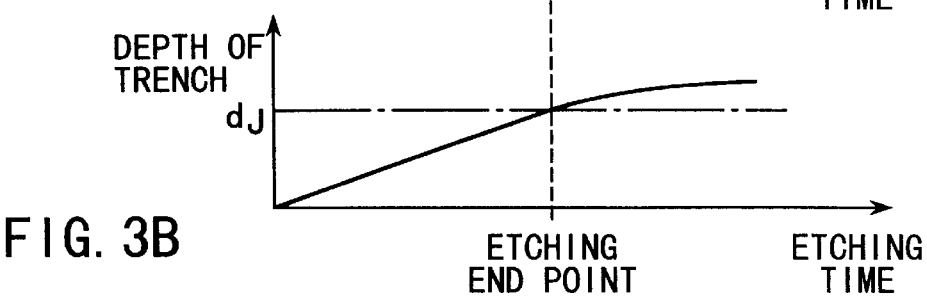
FIG. 3B is a diagram showing the relation between the etching time and the depth of a trench, for illustrating the operation of detecting the etching end point.

As shown in FIG. 2D, if the etching process is continuously effected and the trenches 15 have reached the depletion layer 16 created at the pn junction 12, a leak current increases based on the principle as will be described later and the reverse bias current $J_R$ abruptly increases as shown in FIG. 3A. Since the time point at which the reverse bias current has abruptly increased corresponds to the time point when, the desired depth $d_J$ of the trench 15, is reached the point is determined as the etching end point as shown in FIG. 3B and the RIE process is terminated (STEP 6).

Figure 4:
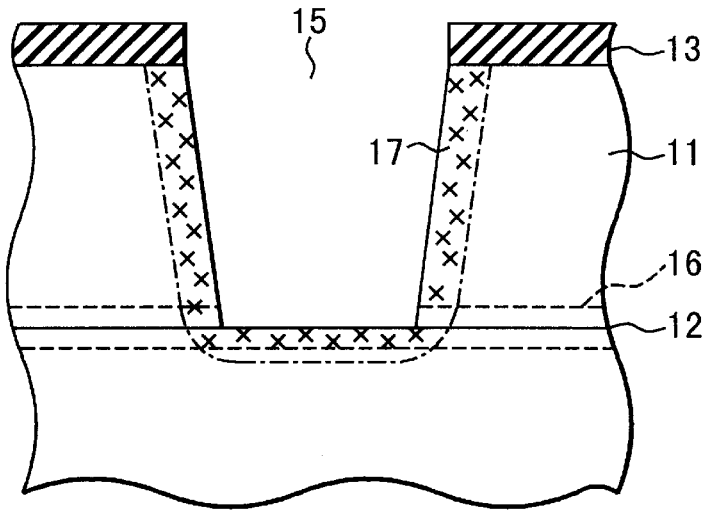
FIG. 4 is an enlarged cross sectional view of a trench for illustrating damaged layers formed in the side wall and bottom portion of the trench at the time of RIE.
Figure 5:
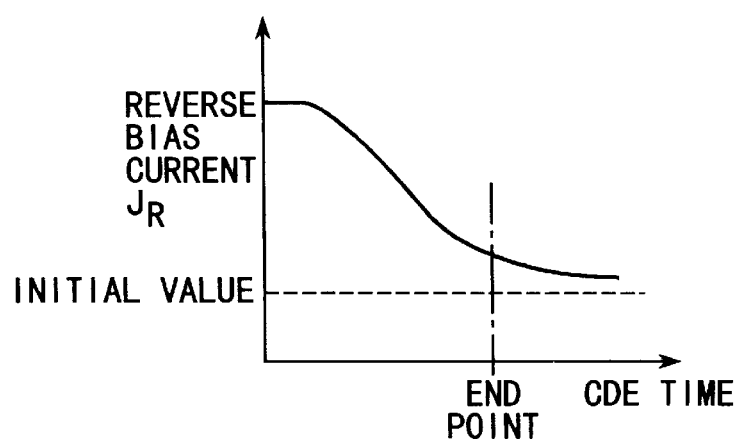
FIG. 5 is a diagram showing the relation between the CDE time for removing the damaged layer and the reverse bias current.

After this, the bottom portions and the side walls of the trenches 15 are etched by use of the CDE (Chemical Dry Etching) process, if required (STEP 7). Since damaged layers 17 caused by, for example, lattice defects are formed on the bottom portion and the side wall of the trench 15 as shown in FIG. 4 at the time of RIE, the above etching process is effected to remove the damaged layers 17. Also, at the time of CDE, the reverse bias current $J_R$ is monitored as in the case of RIE (STEP 8). As shown in FIG. 5, the reverse bias current $J_R$ gradually decreases as the damaged layers 17 are gradually removed by the CDE process. Then, whether the damaged layers 17 have been removed can be determined (STEP 9) by detecting that the reverse bias current $J_R$ has approached the initial value. It is determined that the etching end point is reached when the reverse bias current $J_R$ has become sufficiently near the initial value and the CDE process is terminated (STEP 10). Thus, the monitoring of the reverse bias current $J_R$ in the pn junction 12 can be utilized not only for monitoring the depth of the trench but also for determining damage to the side wall and the bottom portion of the trench by the RIE process or evaluating the quality of the damaged portion. If a variation in the reverse bias current $J_R$ is excessively large, it means that the RIE process is deteriorated. This is because of the increase of the reverse bias current $J_R$ in the pn junction, that is, the junction leak current is detrimental to the performance of the device, for example, it reduces the retention time of the capacitor in the DRAM. Therefore, the reverse bias current $J_R$ should be maintained to a certain satisfiable level.

Next, capacitor electrodes are embedded and formed in the respective trenches 15 (STEP 11), and then, MOS transistors, wiring layers and passivation film are sequentially formed on the semiconductor substrate (STEP 12) and the mounting process into a package is effected to complete the semiconductor device.

Figure 6A:
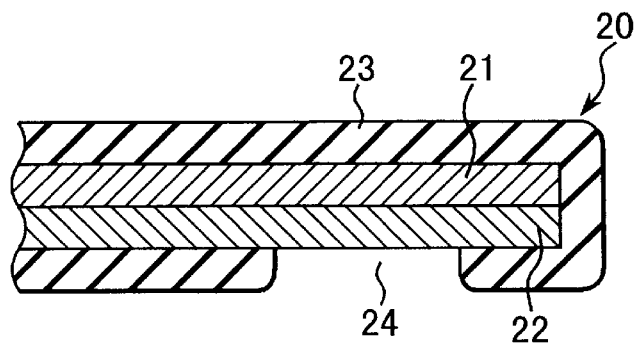
FIG. 6A is an enlarged cross sectional view showing the end portion of a contact sheet, for illustrating the contact sheet used for applying a reverse bias voltage to the pn junction in the semiconductor substrate.
Figure 6B:
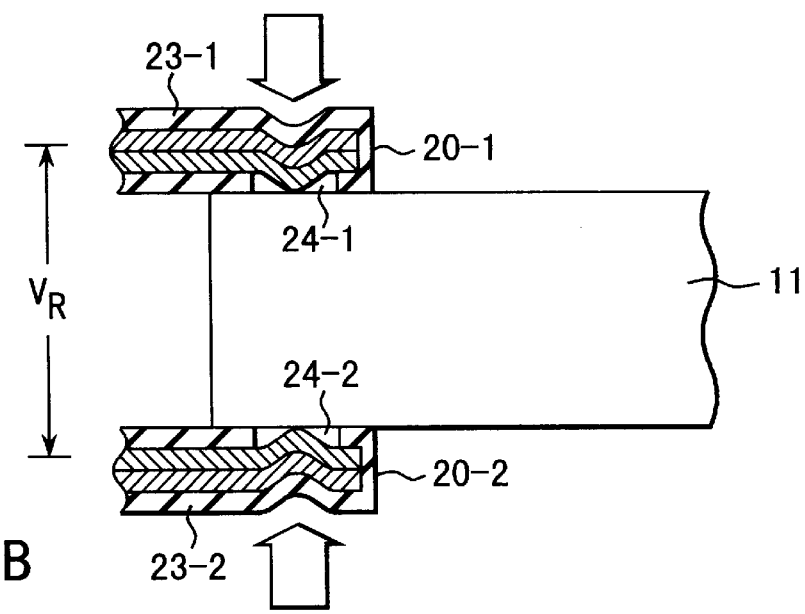
FIG. 6B is an enlarged cross sectional view showing a state in which two contact sheets are set in contact with the semiconductor substrate, for illustrating the contact sheets used for applying a reverse bias voltage to the pn junction in the semiconductor substrate.

FIGS. 6A and 6B show contact sheets used for applying a reverse bias voltage $V_R$ to the pn junction in the semiconductor substrate. FIG. 6A is an enlarged cross sectional view of the end portion of the contact sheet and FIG. 6B is a cross sectional view showing a state in which two contact sheets are set in contact with the semiconductor substrate (wafer). As shown in FIG. 6A, a contact sheet 20 is formed by a doped silicon layer 22 with a thickness of 10 $\mu$m on the surface of a Cu sheet 21 with a thickness of approx. 10 $\mu$m and forming a polyimide layer 23 to cover the surfaces of the Cu sheet and the silicon layer. The thickness of the polyimide layer is approx. 10 $\mu$m and a window 24 of several mm is formed in a portion of the polyimide layer which is brought into contact with the substrate 11. The Cu sheet 21 is used for lowering the resistance and the doped silicon layer 22 which is exposed in the window 24 is used for preventing contamination by the metal since there is a possibility that the substrate is contaminated if the metal sheet 21 is set in direct contact on the substrate 11.

Two contact sheets 20-1 and 20-2 with the above structure are prepared, windows 24-1, 24-2 in the end portions of the sheets 20-1, 20-2 are set to respectively face the main surface and rear surface of the semiconductor substrate 11, pressures are applied to the respective surfaces of polyimide layers 23-1, 23-2 which lie in opposition to the windows 24-1, 24-2 from above and below, respectively, so as to attain the electrical contacts of the sheets with the semiconductor substrate 11. Then, a reverse bias voltage $V_R$ for forming a depletion layer at the pn junction is applied via the sheets 20-1 and 20-2.

Figure 7:
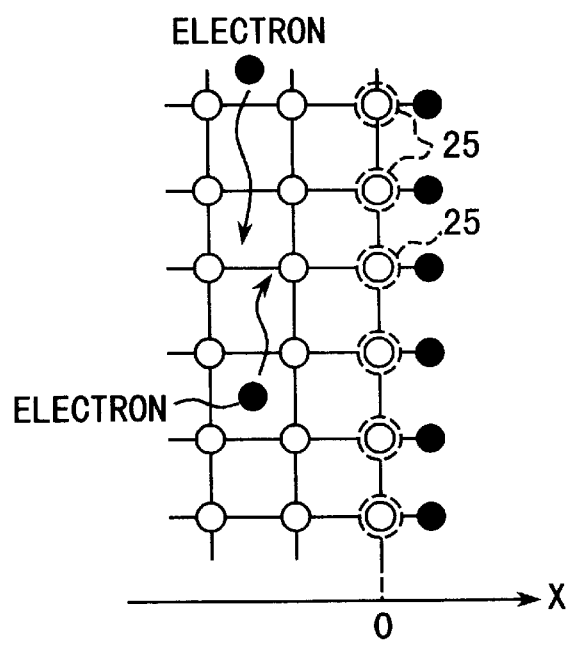
FIG. 7 is a simulation diagram for illustrating localized electronic states existing near atoms on the exposed surface formed by the RIE process of silicon.
Figure 8A:
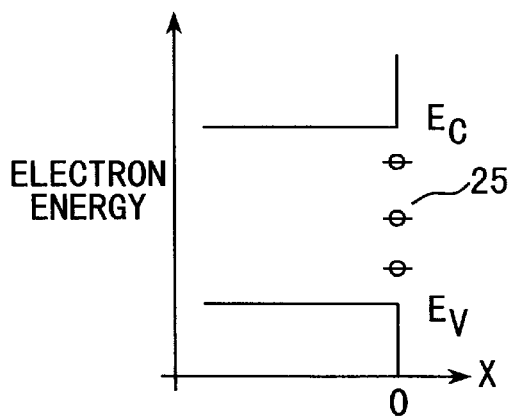
FIG. 8A is an energy band diagram showing the energy levels in the x direction. The surface is defined, by x=0. Localized electronic states on the exposed silicon surface fall into the forbidding gap.

Next, the principle of detecting the etching end point by use of the above method is explained in detail with reference to FIGS. 7 to 10. As shown in FIG. 7, after subjecting the silicon substrate to the RIE process, silicon atoms 25, 25, . . . lying on the exposed surface lose accompanying silicon atoms with which they make chemical bonds, and therefore, electronic states localized near the exposed surface are created. Particularly, when the energy level thereof lies in the forbidden band of a semiconductor, the band diagram in the x direction can be expressed as shown in FIG. 8A.

Figure 8B:
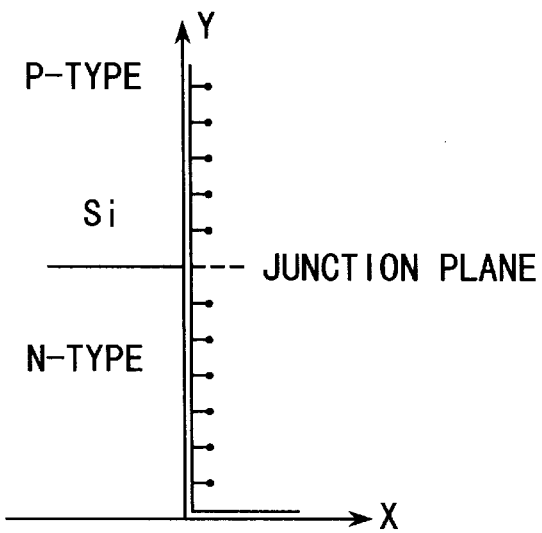
FIG. 8B is a diagram showing a silicon substrate having a pn junction, and real space configuration of localized electronic states existing on the exposed silicon surface by an RIE process.
Figure 8C:
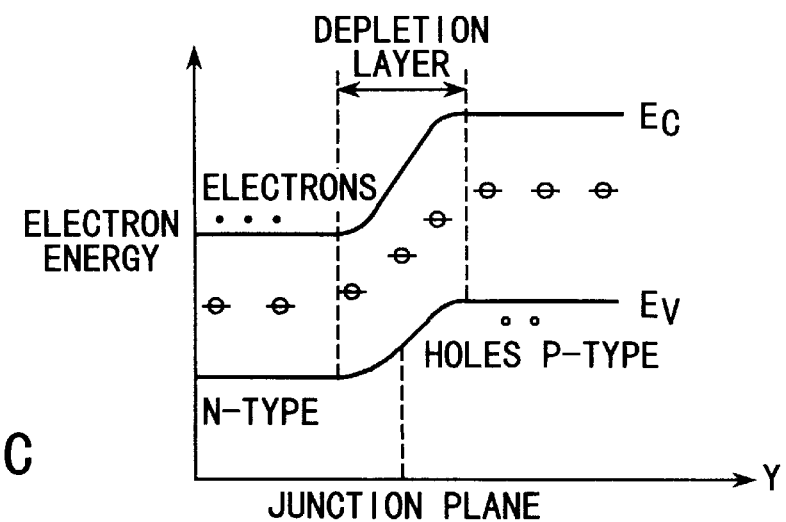
FIG. 8C is an energy band diagram along the y direction, across the pn junction.

FIG. 8B is a showing of the real space of a silicon substrate having a pn junction, and FIG. 8C shows an energy band diagram along y direction at the exposed silicon surface created by the RIE process. Obviously, where the surface crosses the depletion region, band gap states on it also fall into the depletion region. Generally, band gap states in the depletion region facilitate generation of free carriers by alternating hole emission and electron emission processes, thus inducing leak current across the reverse biased pn-junction. Detailed explanation of the free carrier generation mechanism by band gap states in the depletion region is presented in the following for reference.

Figure 9:
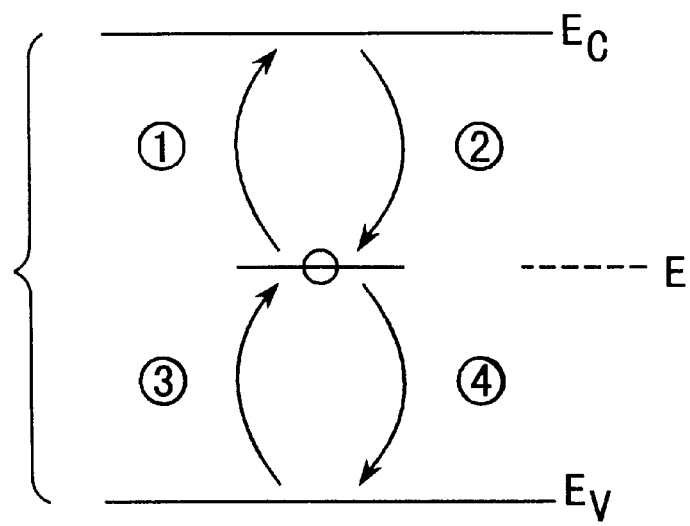
FIG. 9 is an energy band diagram for illustrating the individual processes of charge transfer between the band gap states and the conduction or valence band.

FIG. 9 illustrates individual processes of charge transfer between the band gap states and the condition or valence band. Electron emission from occupied band gap states to the conduction band is denoted by process ①. Conversely, process ② represents electrons in the conduction band being captured by un-occupied gap states. Similarly, process ③ stands for hole emission from un-occupied band gap states to the valence band. Holes in the valence band being captured by occupied gap states is symbolized by process ④. Assuming simple Shockley-Read-Hall statistics on the charge transfer between the band gap states and the conduction or valence band, each process has the following rate, then the frequencies of the cases of ① to ④ can be expressed by the following expressions (1) to (4) (SRH statistics).

$$f \cdot V_{th} \sigma_n n_T^e \qquad n_T^e \equiv n_i e^{\frac{E_T - E_i}{kT}} \qquad (1)$$

$$(1-f) \cdot V_{th} \sigma_n n^e \qquad n^e \equiv n_i e^{\frac{\varphi_n - E_i}{kT}} \qquad (2)$$

$$(1-f) \cdot V_{th} \sigma_p n_T^p \qquad n_T^p \equiv n_i e^{\frac{E_i - E_T}{kT}} \qquad (3)$$

$$f \cdot V_{th} \sigma_p n^p \qquad n^p \equiv n_i e^{\frac{E_i - \varphi_p}{kT}} \qquad (4)$$

In the above expressions (1) to (4), f designates the electron occupancy of the gap state, Ei designates the fermi level of intrinsic semiconductor, $\varphi n$ designates the pseudo-Fermi level of an electron, $\varphi p$ designates the pseudo-Fermi level of a hole, k designates the Bolzmann's constant, and T designates the absolute temperature. Further, Vth indicates the thermal velocity, σn designates an electron capturing cross section, σp designates a hole capturing cross section, $E_T$ indicates an energy level of the gap state, and ni indicates the intrinsic carrier density.

In steady state, it is considered that the sum of the expressions (1) and (4) is equal to the sum of the expressions (2) and (3) and the following equation (5) can be obtained.

$$f = \frac{\sigma_n n^e + \sigma_p n_T^p}{\sigma_n (n^e + n_T^e) + \sigma_p (n^p + n_T^p)} \qquad (5)$$

Since the net generation rate G can be obtained by [expression (1)–expression (2)], the following equation (6) can be derived.

$$G = V_{th} \sigma_n \sigma_p \frac{(n_i^2 - n^e n^p)}{\sigma_n (n^e + n_T^e) + \sigma_p (n^p + n_T^p)} \qquad (6)$$

If $\Delta$Ei and Ei' are expressed by the following equations (7) to (8). Then the equation (6) can be rewritten by the equation (9).

$$\Delta E_i \equiv \frac{kT}{2} \ln\left(\frac{\sigma_p}{\sigma_n}\right) \qquad (7)$$

$$E_i' \equiv E_i + \Delta E_i \qquad (8)$$

$$G = V_{th}(\sigma_n \sigma_p)^{\frac{1}{2}} n_i \frac{\left\{1 - e^{\frac{-(\varphi_p - \varphi_n)}{kT}}\right\}}{\left\{e^{\frac{E_T - E_i'}{kT}} + e^{\frac{\varphi_n - E_i'}{kT}} + e^{\frac{E_i' - E_T}{kT}} + e^{\frac{E_i' - \varphi_p}{kT}}\right\}} \qquad (9)$$

$$= V_{th}(\sigma_n \sigma_p)^{\frac{1}{2}} n_i \frac{\left\{1 - e^{\frac{-(\varphi_p - \varphi_n)}{kT}}\right\}}{2\cosh\left(\frac{E_T - E_i'}{kT}\right) + e^{\frac{\varphi_n - E_i'}{kT}} + e^{\frac{E_i' - \varphi_p}{kT}}}$$

Figure 10:
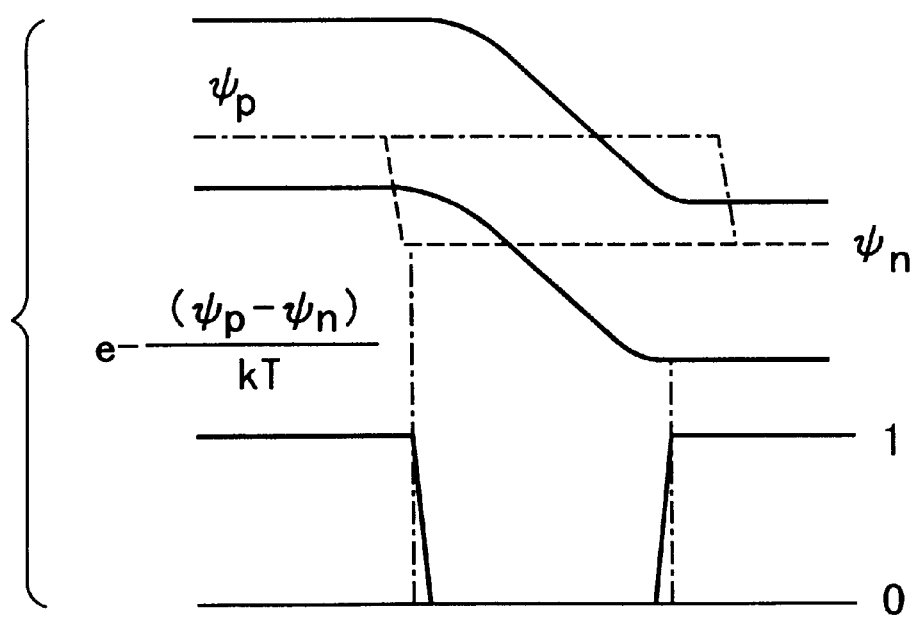
FIG. 10 is an energy band diagram together with quasi-Fermi levels for electron holes along a pn junction under reverse bias condition.
Figure 11:
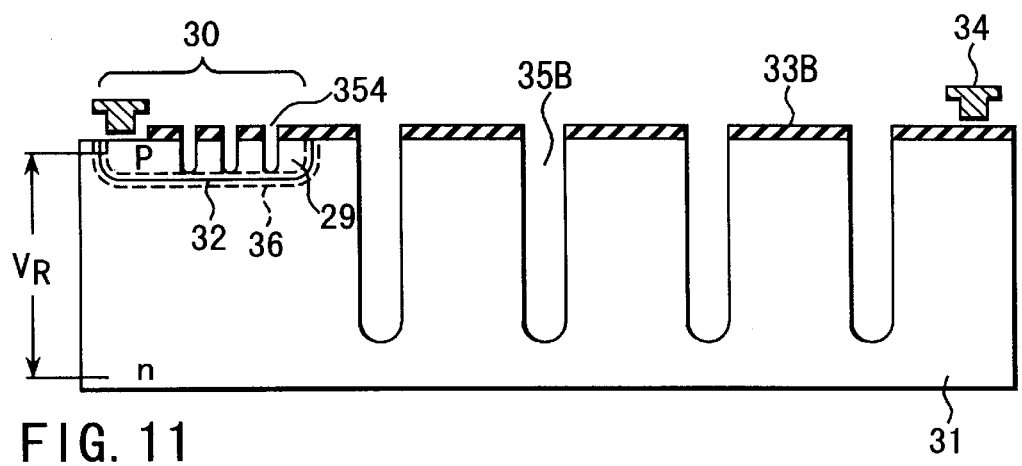
FIG. 11 is a cross sectional view showing the states of the semiconductor substrate (wafer) in the RIE process effected when forming the semiconductor device of DT structure.

As is clearly understood from FIG. 10, since the following equation (10) can be attained in the depletion layer, the equation (9) can be rewritten by the equation (11).

$$e^{\frac{-(\varphi_p - \varphi_n)}{kT}} \simeq 0 \qquad (10)$$

$$G = V_{th}(\sigma_n \sigma_p)^{\frac{1}{2}} n_i \frac{1}{2\cosh\left(\frac{E_T - E_i'}{kT}\right) + e^{\frac{\varphi_n - E_i'}{kT}} + e^{\frac{E_i' - \varphi_p}{kT}}} \qquad (11)$$

Thus, the gap states with their energy level around the mid gap efficiently generate free carriers which are then swiftly swept away by an internal electric field to cause the leak current across the reverse biased pn-junction.

The surface created by RIE process has numerous dangling bonds to form gap states of various energy level. Some of the gap states have an energy level around the mid gap and become efficient free carrier generator as explained above. Therefore, once the RIE surface crosses the depletion region, the gap states on it start to generate free carriers and leak current across the junction increases. In other words, a sudden increase of the leak current signals that the RIE process has just reached the depletion region across the pn-junction. Monitoring the increase of the leak current enables precise end point detection.

In the first embodiment described above, since the depletion layer is formed at the pn junction in the deep trench forming region of the semiconductor substrate and is used as a sensor for detecting the etching end point, the etching end point can be easily detected even when deep trenches are formed unlike any type of conventional optical measuring method. Further, since the depth of the pn junction can be precisely controlled by adequately setting the acceleration energy in the ion-implantation process and effecting the annealing process, the etching end point can be detected with high precision. Further, since it is not necessary to additionally form any elements other than the electrodes for applying a voltage on the semiconductor substrate (wafer) and it is not necessary to provide a large-scale equipment such as a laser measuring device in the reaction chamber of the etching apparatus, the cost of the etching apparatus will not be unnecessarily raised.

In the first embodiment, the pn junction is formed to detect the etching end point, but it is also possible to detect the etching end point by use of a pn junction formed as a well region for appropriate operation of semiconductor devices.

Further, if a plurality of pn junctions are formed at different depths of the etching region, depletion layers are created by applying a reverse bias voltage to the pn junctions, and the progress of the etching process is monitored at a plurality of measurement points, then the etching end point can be controlled more accurately or the etching depth can be monitored more accurately.

In the above example, a case wherein deep trenches are formed is explained, but this invention can be applied to a case wherein shallow trenches are formed. So far a case wherein trenches of constant depth are formed is explained, but if it is required to form a plurality of trenches with different depths, these trenches may be formed by forming pn junctions at corresponding positions at the bottom of the respective trenches and detecting the etching end point for each group of trenches with the same depth.

Next, a method for manufacturing a semiconductor device according to a second embodiment of this invention is explained. In the first embodiment, a case wherein the pn junction is formed in the trench forming region is explained, but in the second embodiment, a monitoring region is designated, a pn junction is formed only in the monitoring region, and the etching end point is detected or the etching depth is monitored in the same manner as in the first embodiment. The monitoring region is preferably formed in a peripheral region of the semiconductor substrate in which no semiconductor devices are designated.

The second embodiment of the present invention uses a pn-junction formed on a monitor region which is located outside of the region where actual devices are to be formed (Active Area). A region such as a dicing area can be used for the monitor region to spare the active area.

Figure 12A:
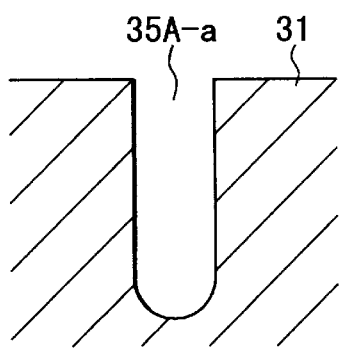
FIG. 12A is a cross sectional view showing a large and deep trench.
Figure 12B:
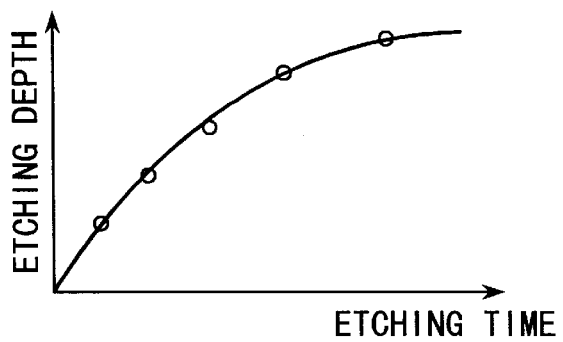
FIG. 12B is a diagram showing the relation between the etching time and the etching depth of the trench shown in FIG. 12A.
Figure 13A:
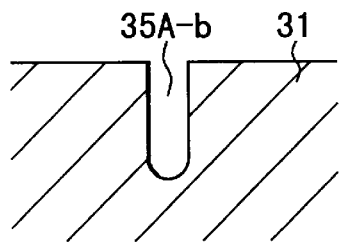
FIG. 13A is a cross sectional view showing a small and shallow trench.
Figure 13B:
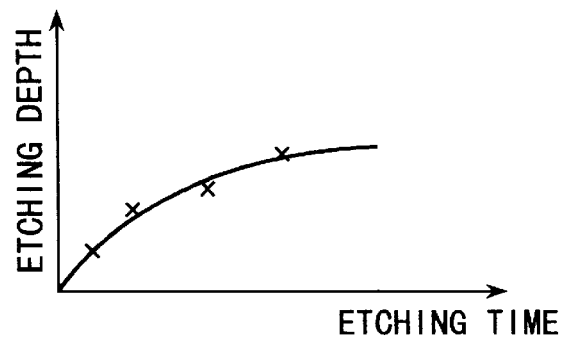
FIG. 13B is a diagram showing the relation between the etching time and the etching depth of the trench shown in FIG. 13A.

First, n-type impurity is incorporated into p-type substrate by means of ion implantation and/or a diffusion method to form a pn-junction of a specific depth in the monitor region. By reason explained below, the depth of the junction does not necessarily coincide with the bottom position of the actual trenches to be formed. Then, TEOS film is deposited on the substrate surface and patterned using photo lithography and etching method to form an etching mask for the subsequent trench etching process. By applying an etching mask having smaller openings in the monitor region compared to the opening dimension in the active area, the depth of the pn-junction required could be much shallower than the depth of the actual deep trenches. This is because, generally, the etching of trenches with a small opening dimension (FIGS. 13A and 13B) proceeds much slower than the etching of trenches with a large opening dimension (FIGS. 12A and 12B). Thus, the small trenches (i.e., monitor trenches in the monitor region) reaching to a specific depth indicate that the large trenches (i.e., actual trenches in the active area) have reached to a certain deeper depth corresponding to the depth of the smaller trenches. Once the depth of small trenches (monitor trenches) is measured with reference to the etching depth of large trenches (actual trenches) and a relation between large trench depth and small trench depth is established, one can use, from this time onward, the shallower pn-junction in the monitor region as an end point sensor. If one tries to etch very deep trenches, this method is particularly helpful since the requirement for forming very deep pn-junction is alleviated. Forming a shallow pn-junction which is easier to form than the deeper one, etching the actual trenches together with the smaller monitor trenches, and the procedure just as described in the previous embodiment enable one to have precise end point detection for deep trench etching. Obviously, the monitor region could have larger trenches than the actual trenches in the case that larger trenches and deeper pn-junctions are easier to form.

After this, the CDE process is effected for the side wall portions and bottom portions of the trenches 35, if necessary.

Also, at the time of CDE process, whether the damaged layers have been sufficiently removed can be determined while monitoring the reverse bias current $J_R$ like the case of the above RIE process. When the reverse bias current $J_R$ has approached the initial value, it is determined that the etching end point is reached and the CDE process is terminated.

Then, after capacitors are formed in the respective trenches 35, MOS transistors, wiring layers and passivation film are sequentially formed on the semiconductor substrate and the mounting process into a package is effected to complete the semiconductor device.

According to the above manufacturing method, since the depletion layer at the pn junction formed in the monitoring region of the semiconductor body is used as a sensor and the process for etching the deep trenches is terminated when the predicted etching depth in the monitoring region is reached, the etching end point can be easily detected even in a case of deep trenches unlike any type of conventional optical measuring method. Further, the depth of the pn junction can be precisely controlled by adequately setting the acceleration energy in the ion-implantation process and effecting the annealing process. The etching end point is not detected by directly measuring the depth of the actual deep trench, but since the etching conditions in the monitoring region and in the deep trench forming region are substantially the same, the etching end point can be predicted with sufficiently high precision. Since it is not necessary to additionally form any elements other than the monitoring region and the electrodes for applying a voltage on the wafer and it is not necessary to provide a large-scale measuring equipment in the reaction chamber of the etching apparatus, the cost of the etching apparatus will not be unnecessarily raised. In the above example, a case wherein deep trenches are formed is explained, but this invention can be applied to a case wherein shallow trenches are formed.

Figure 14:
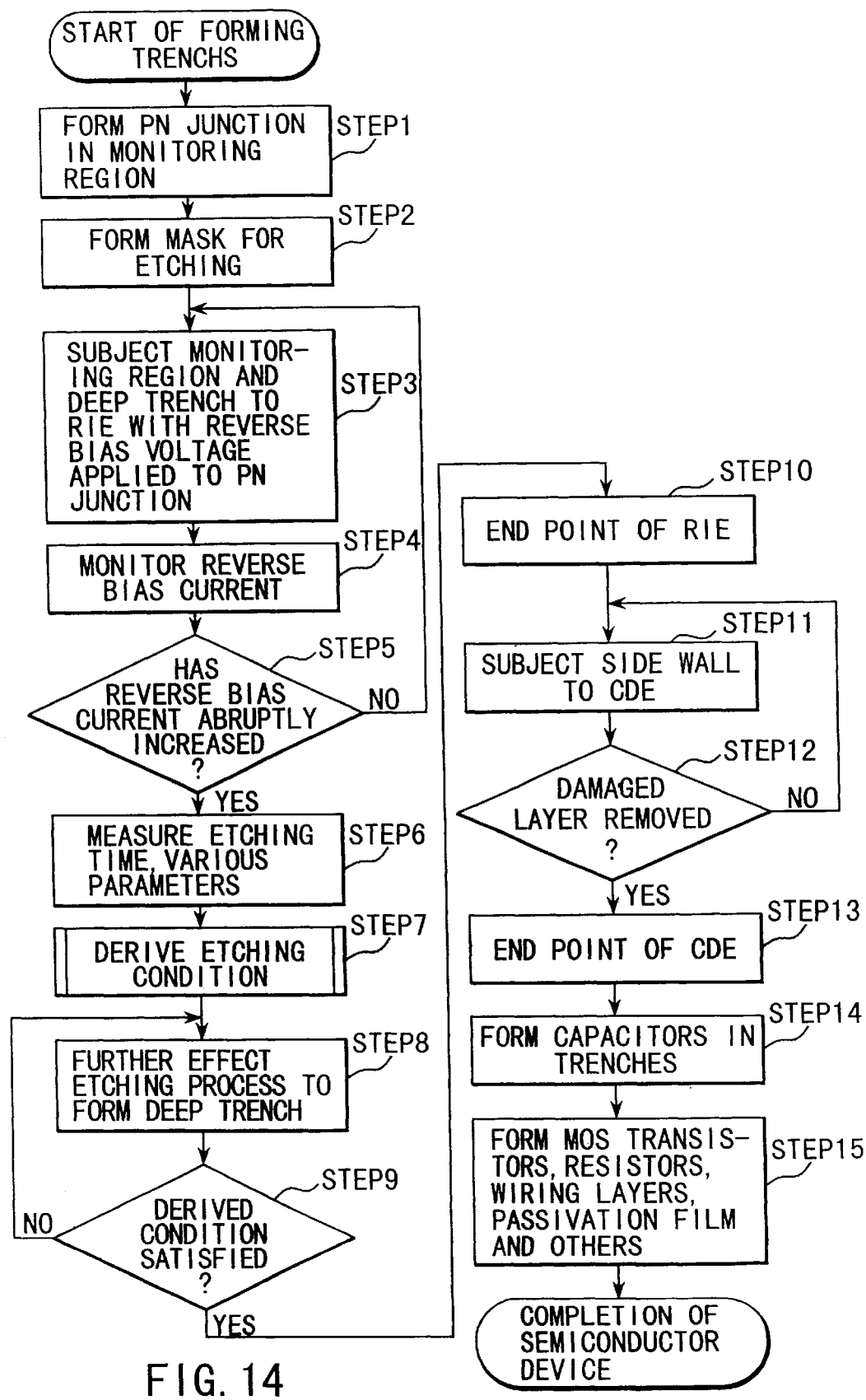
FIG. 14 is a flowchart showing the etching process effected when forming a semiconductor device of DT structure, for illustrating a method for manufacturing a semiconductor device according to a third embodiment of this invention.
Figure 15:
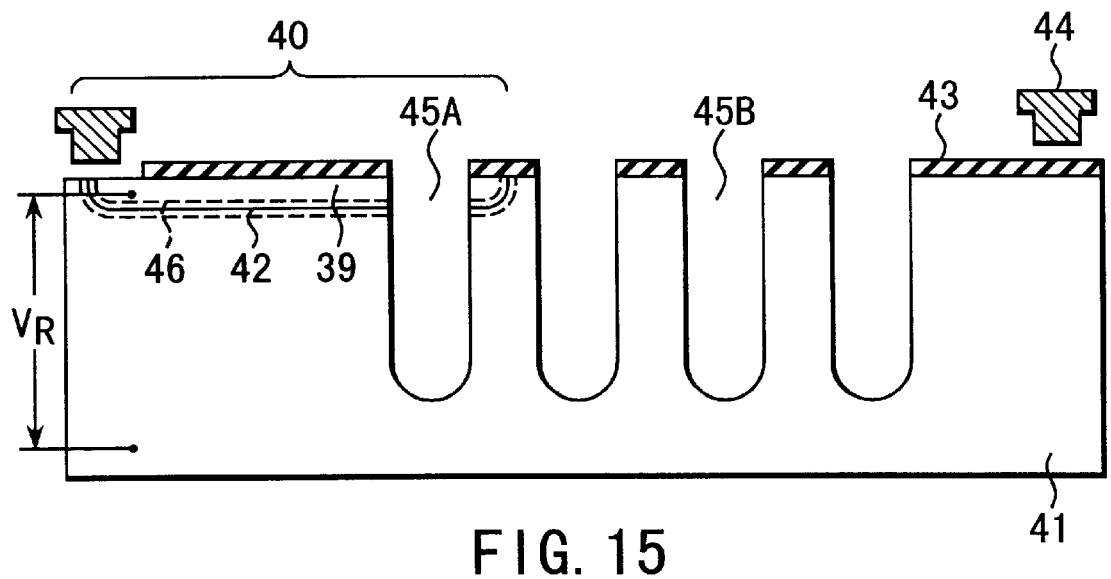
FIG. 15 is a cross sectional view showing a semiconductor substrate in the RIE process shown in the flowchart of FIG. 14.
Figure 16:
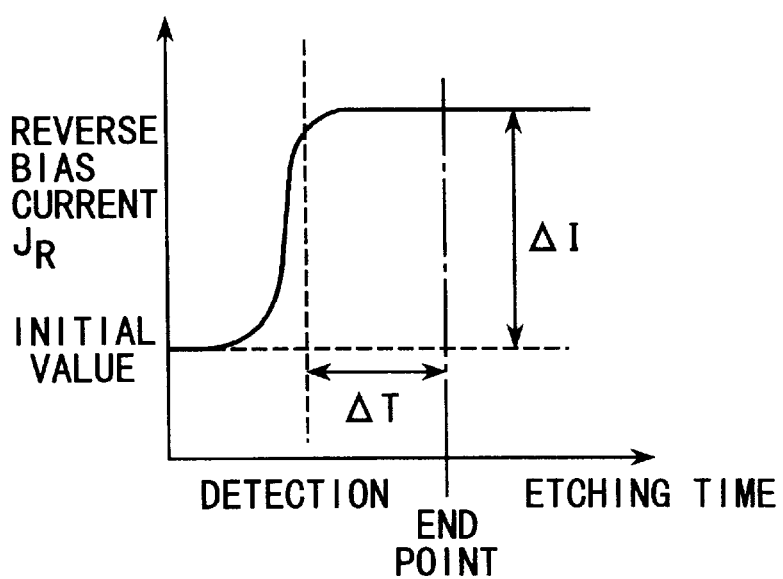
FIG. 16 is a diagram showing the relation between the etching time and the reverse bias current in the RIE process of FIG. 15.

FIGS. 14 to 16 are provided for illustrating a method for manufacturing a semiconductor device according to a third embodiment of this invention. FIG. 14 is a flowchart for illustrating the etching process effected for forming a semiconductor device with deep trench structure. FIG. 15 is a cross sectional view showing a semiconductor substrate in the RIE process. FIG. 16 is a diagram showing the relation between the etching time and the reverse bias current in the RIE process of FIG. 15. First, as shown in FIG. 15, impurity is ion-implanted into a monitoring region 40 (instead of this region, part of a deep trench forming region can be used) of a semiconductor substrate 41 to form a diffusion region 39 so as to form a pn junction 42 (STEP 1). The depth of the pn junction 42 is so controlled as to correspond to a shallower position than the bottom portion of deep trenches.

Next, an etching mask 43 and deep trenches is formed (STEP 2). The mask 43 is formed by forming a TEOS film on the semiconductor substrate 41 and patterning the TEOS film using photolithography, and etching technique for example.

After this, the semiconductor substrate 41 is fixed on a clamp 44, a reverse bias voltage $V_R$ is applied to the pn junction 42 to form a depletion layer 46. The RIE process is effected for the semiconductor substrate 41 to form a monitoring trench 45A and deep trenches 45B (STEP 3). The RIE process is effected while a reverse bias current $J_R$ flowing in the pn junction 42 and the etching time are being monitored (STEP 4). Then, whether the reverse bias current $J_R$ has abruptly increased is determined and the etching process is continued (STEP 5) if no abrupt change is detected.

If the etching process is continuously effected and the trenches have reached the depletion layer 46 created at the pn junction 42, the reverse bias current $J_R$ abruptly increases, and then, the etching time and various parameters obtained at this time are measured (STEP 6). After this, time for the over etching is derived based on the above measured data (STEP 7).

Then, the etching process is further effected to form the deep trenches 45B (STEP 8). At this time, whether the above derived conditions are satisfied is determined (STEP 9), and if the conditions are satisfied, it is determined that the etching end point is reached and the RIE process is terminated (STEP 10). Thus, as shown in FIG. 16, the actual end point is determined after $\Delta T$ from an abrupt increase in the reverse bias current which is derived from the measurement of the RIE condition at the abrupt increase.

After this, if necessary, the bottom portions and the side walls of the trenches are etched by use of the CDE process to remove the damaged layers during RIE (STEP 11). Also, for this process whether the damaged layers have been removed can be determined by monitoring the reverse bias current $J_R$ (STEP 12). Then, when a increase, $\Delta I$, from the initial value has reduced to a certain value, which signals the removal of the damaged layers, the CDE process is terminated (STEP 13).

Next, capacitors are formed in the respective trenches 45 (STEP 14), and then, MOS transistors, wiring layers and passivation film are sequentially formed on the semiconductor substrate 41 (STEP 15) and the mounting process into a package is effected to complete the semiconductor device.

According to the above manufacturing method, since the depletion layer at the pn junction formed in the monitoring region of the semiconductor body is used as a sensor and the etching depth of the deep trench is determined based on the result of monitoring in the monitoring region, the etching end point can be easily detected unlike any type of conventional optical measuring method. Further, since the depth of the pn junction can be precisely controlled by adequately setting the acceleration energy in the ion-implantation process and effecting the annealing process, the etching end point can be detected with high precision. Since it is not necessary to additionally form any elements other than the monitoring region and the electrodes for applying a voltage on the wafer and it is not necessary to provide an equipment in the reaction chamber of the etching apparatus, the cost of the etching apparatus will not be unnecessarily raised.

In the above example, a case wherein deep trenches are formed is explained, but this invention can be applied to a case wherein shallow trenches are formed.

Further, in the above embodiment, a case wherein the sense region is provided only in one position, but more precise monitoring can be attained by providing sense regions in a plurality of portions of the wafer. Further, more precise etching can be attained by forming pn junctions with different depths in the plurality of sense regions and monitoring the etching depths in the monitoring regions.

Figure 17:
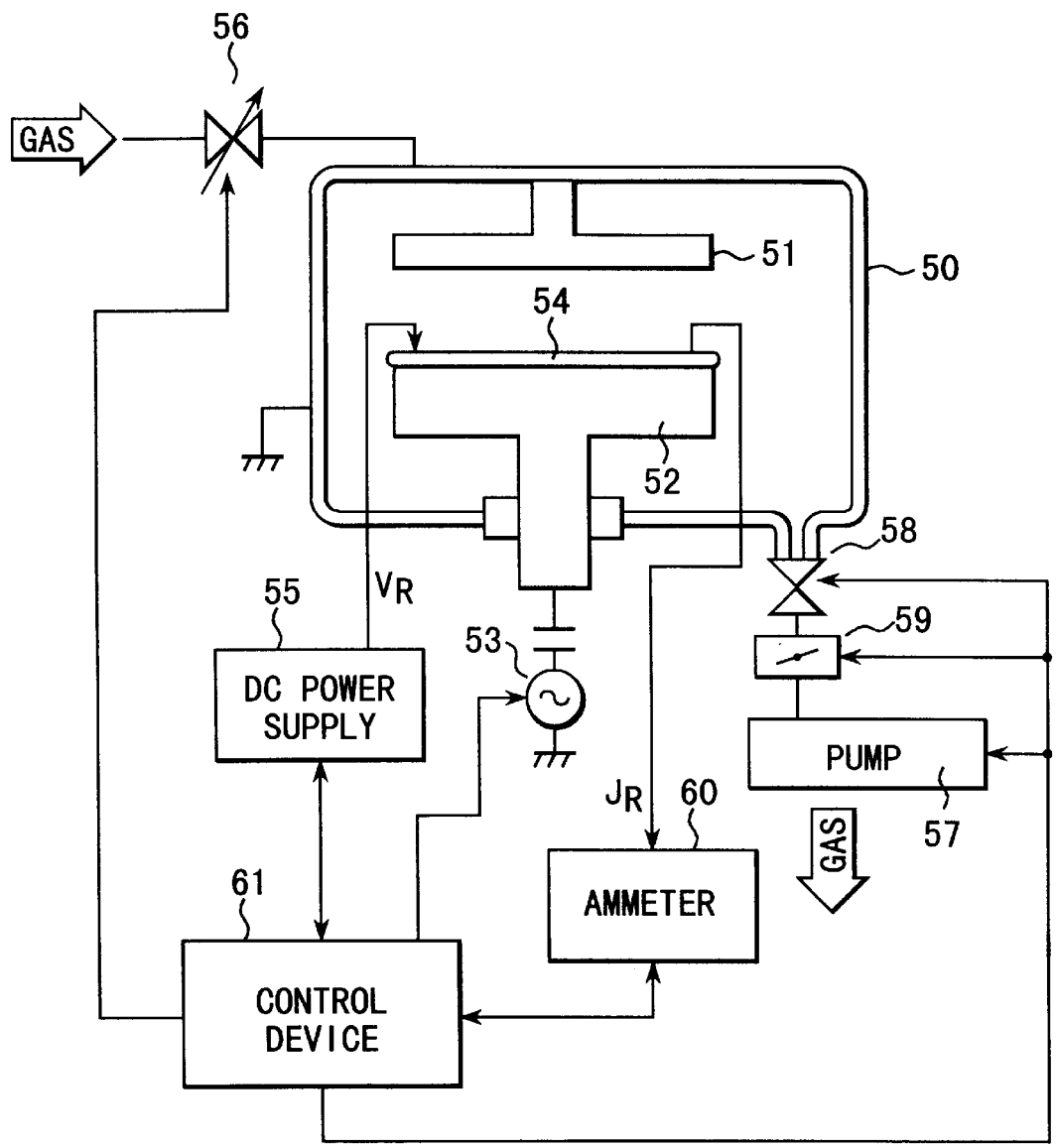
FIG. 17 is a schematic construction diagram showing an etching apparatus according to this invention.

FIG. 17 is a schematic construction diagram showing an etching apparatus for effecting the above-described RIE process. In this case, an example applied to an etching apparatus of a parallel plate type electrode structure is shown. In a reaction chamber 50, an upper electrode 51 and a lower electrode (sample table) 52 are placed to face each other. The sample table 52 is connected to a high-frequency power supply 53 for creation of plasma and drawing of ion. On the sample table 52, a wafer (semiconductor substrate) 54 to be etched is placed. In the wafer 54, a pn junction is formed and a reverse bias voltage $V_R$ is applied to the pn junction via a DC power supply 55 to form a depletion layer.

For the contact with the wafer 54 for applying the reverse bias voltage $V_R$, the contact sheets 20-1, 20-2 shown in FIG. 6B are used. A gas for etching is introduced into the reaction chamber via a gas flow controller 56 and a gas subjected to the reaction is emitted by use of a pump 57 via a main valve 58 and a butterfly valve 59.

During the etching process, the reverse bias current $J_R$ (leak current) is measured by use of an ammeter 60 and the measured value is supplied to a control device 61. The control device 61 includes a detector for detecting an abrupt rise in an output of the ammeter 60, a storage unit for storing data of the various parameters, and an operation unit for deriving the etching time etching conditions based on the data stored in the storage unit and the value measured by the ammeter 60. For example, in the case of first embodiment, the etching end point is detected by detecting an abrupt increase in the reverse bias current $J_R$, and in the cases of second and third embodiments, the etching end point is determined and monitored based on data stored in the storage unit.

If the etching end point is determined by the control device 61, creation of plasma by the high-frequency power supply 53 is interrupted so as to terminate the operation of the etching apparatus.

With the above construction, since it is only required to additionally attach the DC power supply, ammeter and control device to a conventional etching apparatus, it is not necessary to additionally provide large-scale measuring equipment using laser light and the etching end point can be detected or the etching depth can be monitored without unnecessarily raising the cost of the apparatus. Further, since the control device detects an abrupt increase in the reverse bias current and then terminates the etching process, the etching end point can be precisely detected.

As described above, according to this invention, it is possible to provide a method for manufacturing a semiconductor device capable of precisely detecting the etching end point or precisely monitoring the progress of etching.

Further, it is possible to provide a method for manufacturing a semiconductor device suitable for detecting the etching end point effected when forming the STI structure or DT structure in which fine trenches are required to be formed with high precision or precisely monitoring the progress of etching.

Further, it is possible to provide an etching apparatus capable of precisely detecting the etching end point and monitoring the etching depth without unnecessarily raising the cost of the apparatus.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a semiconductor device, comprising the steps of:

forming a pn junction at a predetermined depth in a region of a semiconductor body where an etching process is to proceed;

applying a reverse bias voltage to the pn junction to form a depletion layer;

anisotropically dry etching the semiconductor body while monitoring a reverse bias current flowing via the pn junction; and determining a time point at which the reverse bias current has abruptly increased as an etching end point.

2. A method for manufacturing a semiconductor device, comprising the steps of:

forming a plurality of pn junctions at different depths in a to-be-etched region in a semiconductor body;

applying a reverse bias voltage to the pn junctions to form depletion layers;

anisotropically dry etching the semiconductor body while measuring reverse bias currents flowing via the plurality of pn junctions; and detecting time points at which the reverse bias currents flowing via the respective pn junctions have abruptly increased and monitoring process of the anisotropically dry etching step in regions adjacent to the plurality of pn junctions.

3. A method for manufacturing a semiconductor device, comprising the steps of:

forming a plurality of pn junctions at different depths in a to-be-etched region in a semiconductor body;

applying a reverse bias voltage to the pn junctions to form depletion layers;

anisotropically dry etching the semiconductor body while measuring reverse bias currents flowing via the plurality of pn junctions;

detecting time points at which the reverse bias currents flowing via the respective pn junctions have abruptly increased and monitoring progress of the anisotropically dry etching step in regions adjacent to the plurality of pn junctions; and further effecting the anisotropically dry etching step and controlling an over-etching time based on the time points of abrupt increase in the reverse bias current.

4. A method of manufacturing a semiconductor device, comprising the steps of:

forming a pn junction at a preset depth in a monitoring region of a semiconductor region;

applying a reverse bias voltage to the pn junction to form a depletion layer;

anisotropically dry etching the monitoring region and a to-be-etched region of the semiconductor body while measuring a reverse bias current flowing via the pn junction; and determining a time point at which the reverse bias current has abruptly increased as an etching end point.

5. A method for manufacturing a semiconductor device according to claim 4, wherein the monitoring region is a peripheral region of the semiconductor body on which no semiconductor elements are formed.

6. A method for manufacturing a semiconductor device according to claim 4, wherein the monitoring region is formed on a dicing line of the semiconductor body.

7. A method for manufacturing a semiconductor device, comprising the steps of:

forming a pn junction at a preset depth in a monitoring region of a semiconductor body;

applying a reverse bias voltage to the pn junction to form a depletion layer;

anisotropically dry etching the monitoring region and a to-be-etched region of the semiconductor body while measuring a reverse bias current flowing via the pn junction; detecting a time point at which the reverse bias current has abruptly increased; and further effecting the anisotropically dry etching step and controlling an over-etching time based on the time pint of abrupt increase in the reverse bias current.

8. A method for manufacturing a semiconductor device according to claim 7, wherein the monitoring region is a peripheral region of the semiconductor body on which no semiconductor elements are formed.

9. A method for manufacturing a semiconductor. device according to claim 7, wherein the monitoring region is formed on a dicing line of the semiconductor body.

10. A method for manufacturing a semiconductor device, comprising the steps of:

forming a plurality of pn junctions at different depths in a monitoring region of a semiconductor body;

applying a reverse bias voltage to the pn junctions to form depletion layers;

anisotropically dry etching the semiconductor body while monitoring reverse bias currents flowing via the plurality of pn junctions; and detecting time points at which the reverse bias currents flowing via the respective pn junctions have abruptly increased.

11. A method for manufacturing a semiconductor device according to claim 10, wherein the monitoring region is a peripheral region of the semiconductor body on which no semiconductor elements are formed.

12. A method for manufacturing a semiconductor device according to claim 10, wherein the monitoring region is formed on a dicing line of the semiconductor body.

13. A method for manufacturing a DRAM, comprising the steps of:

previously forming a pn junction in a region to form deep trenches as a storage capacitor;

forming a mask used for forming deep trenches in a semiconductor substrate;

applying a reverse bias voltage to the pn junction to form a depletion layer;

subjecting the semiconductor substrate to an anisotropic etching process to form deep trenches by use of the mask while measuring a reverse bias current flowing via the pn junction; and detecting a time point at which the reverse bias current has abruptly increased and terminating the anisotropic etching process.

14. A method for manufacturing a semiconductor device according to claim 13, which further comprises a step of subjecting an interior surface of the deep trenches to an isotropic etching process while measuring the reverse bias current flowing via the pn junction after the end of the anisotropic etching process for the deep trenches and in which said isotropic etching process is terminated when the reverse bias current has approached a value recorded prior to the abrupt increase observed during the anisotropic etching process.

15. A method for manufacturing a semiconductor device according to claim 13, further comprising a step of embedding and forming semiconductor material in the deep trenches.

16. A method for manufacturing a semiconductor device according to claim 13, further comprising a step of forming an electronic device on an upper surface area of the semiconductor substrate.

17. A method for manufacturing a semiconductor device according to claim 13, wherein said mask is a TEOS film.

18. A method for manufacturing a DRAM, comprising the steps of:

forming a pn junction in a monitoring region in a semiconductor substrate;

forming a mask used for etching the monitoring region and deep trenches on the semiconductor substrate;

applying a reverse bias voltage to the pn junction to form a depletion layer;

subjecting the monitoring region to an anisotropic etching process by use of the mask while measuring a reverse bias current flowing via the pn junction; and detecting a time point at which the reverse bias current has abruptly increased and predicting an end point of the anisotropic etching end point for deep trenches based on an etching rate of the monitoring region.

19. A method for manufacturing a semiconductor device according to claim 18, which further comprises a step of subjecting an interior surface of the deep trenches to an isotropic etching process while measuring the reverse bias current flowing via the pn junction after the end of the anisotropic etching process for the deep trenches and in which said isotropic etching process is terminated when the reverse bias current has approached a value recorded prior to the abrupt increase observed during the anisotropic etching process.

20. A method for manufacturing a semiconductor device according to claim 18, further comprising a step of forming insulating materials on an interior surface of the deep trenches.

21. A method for manufacturing a semiconductor device according to claim 18, further comprising a step of embedding and forming semiconductor material in the deep trenches.

22. A method for manufacturing a DRAM, comprising the steps of:

forming a pn junction in a monitoring region in a semiconductor substrate;

forming a mask used for etching the monitoring region and deep trenches on the semiconductor substrate;

applying a reverse bias voltage to the pn junction to form a depletion layer;

subjecting the monitoring region to an anisotropic etching process by use of the mask while measuring a reverse bias current flowing via the pn junction;

detecting a time point at which the reverse bias current has abruptly increased and predicting an end point of the anisotropic etching process for deep trenches based on an etching rate of the monitoring region; and further effecting the anisotropic etching process to a predicted depth to form the deep trenches.

23. A method for manufacturing a semiconductor device, comprising the steps of:

forming a pn junction in a region to form a shallow trench for device isolation;

forming a mask used for forming shallow trenches in a semiconductor substrate;

applying a reverse bias voltage to the pn junction to form a depletion layer;

subjecting the semiconductor substrate to an anisotropic etching process by use of the mask while monitoring a reverse bias current flowing via the pn junction; and detecting a time point at which the reverse bias current has abruptly increased and then terminating the anisotropic etching process.

24. A method for manufacturing a semiconductor device according to claim 23, which further comprises a step of subjecting an interior surface of the shallow trenches to an isotropic etching process while measuring the reverse bias current flowing via the pn junction after the end of the anisotropic etching process for the trenches and in which said isotropic etching process is terminated when the reverse bias current has approached a value recorded prior to the abrupt increase observed during the anisotropic etching process.

25. A method for manufacturing a semiconductor device according to claim 23, further comprising a step of filling insulating materials in the shallow trenches.

26. A method for manufacturing a semiconductor device according to claim 23, further comprising a step of forming an electronic device on an upper surface area of the semiconductor substrate on which the shallow trenches delineate active device regions divided and defined by the shallow trenches.

27. A method for manufacturing a semiconductor device, comprising the steps of:

forming a pn junction in a monitoring region in a semiconductor substrate;

forming a mask on the semiconductor substrate;

applying a reverse bias voltage to the pn junction to form a depletion layer;

subjecting the monitoring region and device region to an anisotropic etching process by use of the mask while measuring a reverse bias current flowing via the pn junction; and detecting a time point at which the reverse bias current has abruptly increased and predicting an end point of the anisotropic etching process for shallow trenches based on an etching rate of the monitoring region.

28. A method for manufacturing a semiconductor device according to claim 27, which further comprises a step of subjecting an interior surface of the shallow trenches to an isotropic etching process while measuring the reverse bias current flowing via the pn junction after the end of the anisotropic etching process for the shallow trenches and in which said isotropic etching process is terminated when the reverse bias current has approached a value recorded prior to the abrupt increase observed during the anisotropic etching process.

29. A method for manufacturing a semiconductor device according to claim 27, further comprising a step of filling insulating materials in the shallow trenches.

30. A method for manufacturing a semiconductor device according to claim 27, further comprising a step of forming an electronic device on an upper surface area of the semiconductor substrate in element regions divided and defined by the shallow trenches.

31. A method for manufacturing a DRAM, comprising the steps of:

forming a pn junction in a monitoring region in a semiconductor substrate;

forming a mask used for etching the monitoring region and deep trenches on the semiconductor substrate;

applying a reverse bias voltage to the pn junction to form a depletion layer;

subjecting the monitoring region and deep trench forming region to an anisotropic etching process by use of the mask while measuring a reverse bias current flowing via the pn junction;

detecting a time point at which the reverse bias current has abruptly increased and predicting an end point of the anisotropic etching process for deep trenches based on an etching rate of the monitoring region; and further effecting the anisotropic etching process to a predicted depth to form the deep trenches.

32. A method for manufacturing a semiconductor device according to claim 31, which further comprises a step of subjecting an interior surface of the deep trenches to an isotropic etching process while measuring the reverse bias current flowing via the pn junction after the end of the anisotropic etching process for the deep trenches and in which said isotropic etching process is terminated when the reverse bias current has approached a value recorded prior to the abrupt increase observed during the anisotropic etching process.

33. A method for manufacturing a semiconductor device according to claim 31, further comprising a step of forming insulating material on an interior surface of the deep trenches.

34. A method for manufacturing a semiconductor device according to claim 31, further comprising a step of embedding and forming semiconductor material in the deep trenches.

* * * * *